(12) United States Patent
Jung et al.

(10) Patent No.: US 10,109,694 B2
(45) Date of Patent: Oct. 23, 2018

(54) ORGANIC LIGHT-EMITTING DIODE DISPLAY

(71) Applicant: Samsung Display Co., Ltd., Yongin-si, Gyeonggi-do (KR)

(72) Inventors: Young Bae Jung, Cheonan-si (KR); Hyun Tae Kim, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 133 days.

(21) Appl. No.: 15/216,357

(22) Filed: Jul. 21, 2016

(65) Prior Publication Data

US 2017/0025492 A1    Jan. 26, 2017

(30) Foreign Application Priority Data

Jul. 23, 2015  (KR) .................. 10-2015-0104477

(51) Int. Cl.
*H01L 27/32* (2006.01)
*H01L 27/12* (2006.01)
*H01L 29/786* (2006.01)

(52) U.S. Cl.
CPC ...... *H01L 27/3262* (2013.01); *H01L 27/3265* (2013.01); *H01L 27/3276* (2013.01); *H01L 27/1222* (2013.01); *H01L 27/1255* (2013.01); *H01L 29/7869* (2013.01); *H01L 29/78675* (2013.01)

(58) Field of Classification Search
None
See application file for complete search history.

(56) References Cited

U.S. PATENT DOCUMENTS

| 8,797,238 B2 | 8/2014 | Kwak et al. | |
| 2016/0104758 A1* | 4/2016 | Kim | H01L 28/60 257/40 |
| 2016/0204172 A1* | 7/2016 | Park | H01L 27/3248 257/40 |

FOREIGN PATENT DOCUMENTS

| JP | 2008-287135 A | 11/2008 |
| KR | 10-0426031 B1 | 3/2004 |
| KR | 10-1486038 B1 | 1/2015 |

* cited by examiner

*Primary Examiner* — Lex Malsawma

(57) ABSTRACT

An OLED display is disclosed. In one aspect, the display includes a first TFT formed over a substrate and including a gate electrode and a second TFT electrically connected to the first TFT. A gate bridge is formed over the gate electrode and configured to electrically connect the gate electrode and the second TFT, the gate bridge connected to the gate electrode through a contact hole formed over the first TFT. A capacitor electrode is formed over the gate bridge, an insulating layer is interposed between the capacitor electrode and the gate bridge, and the capacitor electrode, the insulating layer, and the gate bridge form a capacitor. An OLED is electrically connected to the first TFT.

20 Claims, 5 Drawing Sheets

ORGANIC LIGHT-EMITTING DIODE DISPLAY

RELATED APPLICATIONS

This application claims priority to and the benefit of Korean Patent Application No. 10-2015-0104477 filed in the Korean Intellectual Property Office on Jul. 23, 2015, the entire contents of which are incorporated herein by reference.

BACKGROUND

Field

The described technology generally relates to an organic light-emitting diode (OLED) display.

Description of the Related Technology

Generally, examples of flat panel display types include an OLED displays, liquid crystal display (LCDs), plasma display panels (PDPs), etc.

OLED technology utilizes many pixel circuits, where each circuit contains multiple thin film transistors (TFTs), a capacitor and an OLED connected to the TFTs.

Due to increasing market demands, OLED displays are required to have high resolution with an increased number of pixels per inch (ppi).

The above information disclosed in this Background section is only for enhancement of understanding of the background of the described technology and therefore it can contain information that does not form the prior art that is already known in this country to a person of ordinary skill in the art.

SUMMARY OF CERTAIN INVENTIVE ASPECTS

One inventive aspect relate to an OLED display having improved capacitance when the OLED display is manufactured to have high resolution with an increased number pixels per inch (ppi).

Another aspect is an OLED display including: a substrate; a first thin film transistor provided on the substrate and including a gate electrode; a second thin film transistor connected to the first thin film transistor; gate bridge provided on the gate electrode to connect between the gate electrode and the second thin film transistor, and connected to the gate electrode through a contact hole; a capacitor electrode provided on the gate bridge, and forming a capacitor together with the gate bridge; and an OLED connected to the first thin film transistor.

The OLED display can further include a driving power line connected to the first thin film transistor, wherein the driving power line is integrally formed with the capacitor electrode.

Another aspect is an OLED display that includes: a substrate; a first thin film transistor provided on the substrate and including a first gate electrode; a second thin film transistor connected to the first thin film transistor; a data line connected to the second thin film transistor; a third thin film transistor connected to the first thin film transistor; a gate bridge provided on the first gate electrode to connect between the third thin film transistor and the first gate electrode, and connected to the first gate electrode through a contact hole; a capacitor electrode provided on the gate bridge, overlapping the gate bridge, and forming a capacitor together with the gate bridge; and an OLED connected to the first thin film transistor.

The gate bridge can cover the first gate electrode.

The OLED display can further include a driving power line connected to the first thin film transistor, and the capacitor electrode can be integrally formed with the driving power line.

The data line and the capacitor electrode can be provided on different layers on the substrate.

Another aspect is an OLED display including: a substrate; a first thin film transistor including a first active pattern provided on the substrate and a first gate electrode provided on the first active pattern; a second thin film transistor including a second active pattern connected to a first terminal of the first active pattern and a second gate electrode provided on the second active pattern; a data line provided on the second active pattern and connected to the second active pattern; a third thin film transistor including a third active pattern connected to a second terminal of the first active pattern and a third gate electrode provided on the third active pattern; a gate bridge provided on the first gate electrode to connect between the third active pattern and the first gate electrode, and connected to the first gate electrode through a contact hole; a driving power line neighboring the data line, and connected to the first active pattern; a capacitor electrode connected to the driving power line to be provided on the gate bridge, and overlapping the gate bridge to form a capacitor together with the gate bridge; and an OLED connected to the first active pattern.

The gate bridge can cover the first gate electrode.

The gate bridge can include: an overlapped portion overlapping the capacitor electrode; an extension extending to the third active pattern from the overlapped portion; and a protrusion protruded from the overlapped portion, at least part of the protrusion not overlapping the capacitor electrode.

The overlapped portion can be connected to the first gate electrode through the contact hole.

The data line extends in a first direction on the substrate, and the capacitor electrode can extend in a second direction crossing the data line on the substrate.

The data line and the capacitor electrode can be respectively provided on different layers on the substrate.

The data line can be provided on the capacitor electrode.

The capacitor electrode can be provided on the data line.

The capacitor electrode can be integrally formed with the driving power line.

The capacitor electrode and the driving power line can respectively extend in different directions on the substrate.

The gate bridge and the capacitor electrode can be respectively formed of a metal.

The OLED display can further include: a first scan line provided on the second active pattern to traverse the second active pattern and the third active pattern, and connected to the second gate electrode and the third gate electrode; a fourth thin film transistor including a fourth active pattern connected to the third active pattern and connected to the first gate electrode through the gate bridge and a fourth gate electrode provided on the fourth active pattern; a second scan line provided on the fourth active pattern to traverse the fourth active pattern, and connected to the fourth gate electrode; and an initialization power line connected to the fourth active pattern.

The OLED display can further include: a fifth thin film transistor including a fifth active pattern for connecting between the first active pattern and the driving power line, and a fifth gate electrode provided on the fifth active pattern; a sixth thin film transistor including a sixth active pattern for connecting between the first active pattern and the OLED, and a sixth gate electrode provided on the sixth active pattern; and an emission control line provided on the fifth active pattern and the sixth active pattern to traverse the fifth active pattern and the sixth active pattern, and connected to the fifth gate electrode and the sixth gate electrode.

The OLED display can further include: a seventh thin film transistor including a seventh active pattern connected to the fourth active pattern and a seventh gate electrode provided on the seventh active pattern; and a third scan line provided on the seventh active pattern to traverse the seventh active pattern, and connected to the seventh gate electrode.

Another aspect is an organic light-emitting diode (OLED) display comprising: a substrate; a first thin film transistor (TFT) formed over the substrate and including a gate electrode; a second TFT electrically connected to the first TFT; a gate bridge formed over the gate electrode and configured to electrically connect the gate electrode and the second TFT, wherein the gate bridge is connected to the gate electrode through a contact hole formed over the first TFT; a capacitor electrode formed over the gate bridge; an insulating layer interposed between the capacitor electrode and the gate bridge, wherein the capacitor electrode, the insulating layer, and the gate bridge form a capacitor; and an OLED electrically connected to the first TFT.

The above OLED display further comprises a driving power line electrically connected to the first TFT, wherein the driving power line is integrally formed with the capacitor electrode.

Another aspect is an OLED display comprising: a substrate; a first thin film transistor (TFT) formed over the substrate and including a first gate electrode; a second TFT electrically connected to the first TFT; a data line electrically connected to the second TFT; a third TFT electrically connected to the first TFT; a gate bridge formed over the first gate electrode and configured to electrically connect the third TFT and the first gate electrode, wherein the gate bridge is connected to the first gate electrode through a contact hole formed over the first TFT; a capacitor electrode formed over and overlapping the gate bridge in the depth dimension of the OLED display; an insulating layer interposed between the capacitor electrode and the gate bridge, wherein the capacitor electrode, the insulating layer, and the gate bridge form a capacitor; and an OLED electrically connected to the first TFT.

In the above OLED display, the gate bridge covers the first gate electrode.

The above OLED display further comprises a driving power line electrically connected to the first TFT, wherein the capacitor electrode is integrally formed with the driving power line.

In the above OLED display, the data line and the capacitor electrode are formed on different layers.

Another aspect is an OLED display comprising: a substrate; a first thin film transistor (TFT) including a first active pattern formed over the substrate and a first gate electrode formed over the first active pattern; a second TFT including a second active pattern connected to a first terminal of the first active pattern and a second gate electrode formed over the second active pattern; a data line formed over the second active pattern and electrically connected to the second active pattern; a third TFT including a third active pattern electrically connected to a second terminal of the first active pattern and a third gate electrode formed over the third active pattern; a gate bridge formed over the first gate electrode and configured to electrically connect the third active pattern and the first gate electrode, wherein the gate bridge is connected to the first gate electrode through a contact hole formed over the first TFT; a driving power line neighboring the data line and electrically connected to the first active pattern; a capacitor electrode electrically connected to the driving power line and formed over the gate bridge; an insulating layer interposed between the capacitor electrode and the gate bridge, wherein the capacitor electrode, the insulating layer and the gate bridge form a capacitor; and an OLED electrically connected to the first active pattern.

In the above OLED display, the gate bridge covers the first gate electrode.

In the above OLED display, the gate bridge includes: an overlapped portion overlapping the capacitor electrode; an extension extending from the overlapped portion to the third active pattern; and a protrusion protruding from the overlapped portion, wherein at least a portion of the protrusion does not overlap the capacitor electrode.

In the above OLED display, the overlapped portion is connected to the first gate electrode through the contact hole.

In the above OLED display, the data line extends in a first direction, wherein the capacitor electrode extends in a second direction crossing the data line.

In the above OLED display, the data line and the capacitor electrode are formed on different layers.

In the above OLED display, the data line is formed over the capacitor electrode.

In the above OLED display, the capacitor electrode is formed over the data line.

In the above OLED display, the capacitor electrode is integrally formed with the driving power line.

In the above OLED display, the capacitor electrode and the driving power line extend in different directions.

In the above OLED display, the gate bridge and the capacitor electrode are formed of a metal.

The above OLED display further comprises: a first scan line formed over the second and third active patterns and electrically connected to the second and third gate electrodes; a fourth TFT including i) a fourth active pattern connected to the third active pattern and connected to the first gate electrode through the gate bridge and ii) a fourth gate electrode formed over the fourth active pattern; a second scan line formed over the fourth active pattern and electrically connected to the fourth gate electrode; and an initialization power line electrically connected to the fourth active pattern.

The above OLED display further comprises: a fifth TFT including a fifth active pattern electrically connected to the driving power line and a fifth gate electrode formed over the fifth active pattern; a sixth TFT including a sixth active pattern electrically connected to the OLED and a sixth gate electrode formed over the sixth active pattern; and an emission control line formed over the fifth and sixth active patterns, wherein the emission control line is connected to the fifth and sixth gate electrodes.

The above OLED display further comprises: a seventh TFT including a seventh active pattern connected to the fourth active pattern and a seventh gate electrode formed over the seventh active pattern; and a third scan line formed over the seventh active pattern and connected to the seventh gate electrode.

According to at least one of the disclosed embodiments, when the high-resolution OLED display with an increased number of pixels per inch (ppi) is manufactured, the OLED display with improved capacitance is provided.

DETAILED DESCRIPTION OF CERTAIN INVENTIVE EMBODIMENTS

Figure 1:
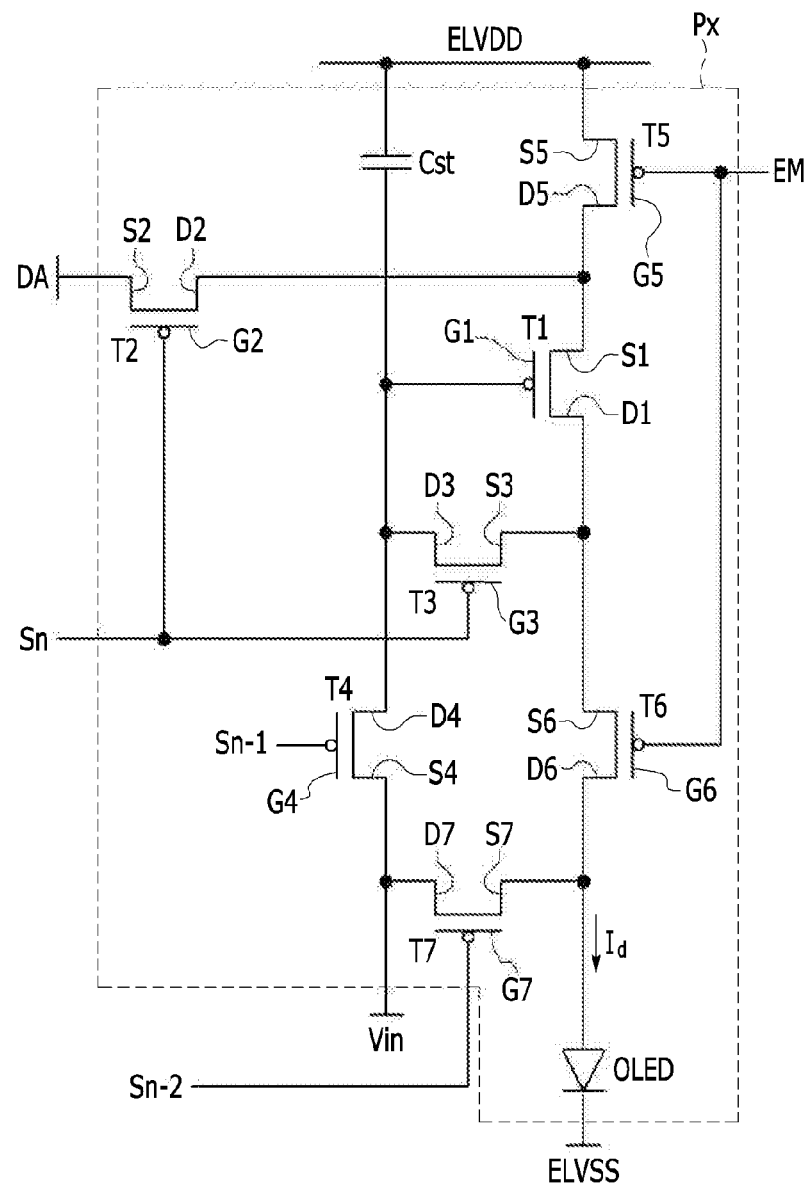
FIG. 1 shows a circuit diagram of a pixel of an OLED display according to an exemplary embodiment.

In the following detailed description, only certain exemplary embodiments have been shown and described, simply by way of illustration. As those skilled in the art would realize, the described embodiments can be modified in various different ways, all without departing from the spirit or scope of the present invention.

Parts that are unrelated to the description of the exemplary embodiments are not shown to make the description clear, and like reference numerals designate like element throughout the specification.

Furthermore, with exemplary embodiments, detailed description is made as to the constituent elements in the first exemplary embodiment with reference to the relevant drawings by using the same reference numerals for the same constituent elements, while only the constituent elements different from those related to the first exemplary embodiment are described in other exemplary embodiments.

The size and thickness of each component illustrated in the drawings are arbitrarily illustrated in the drawings for better understanding and ease of description, but the described technology is not limited to the illustrations.

In the drawings, the thickness of layers, films, panels, regions, etc., are exaggerated for clarity. The thickness of the layers, films, panels, regions, etc., is enlarged in the drawings for better understanding and ease of description.

Unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

An OLED display according to an exemplary embodiment will now be described with reference to FIG. 1 to FIG. 3.

A circuit of a pixel of an OLED display according to an exemplary embodiment will now be described with reference to FIG. 1. Here, the pixel can mean a minimum unit in which an image is displayed.

FIG. 1 shows a circuit diagram of a pixel of an OLED display according to an exemplary embodiment.

As shown in FIG. 1, one pixel Px of the OLED display according to an exemplary embodiment includes a plurality of thin film transistors (TFTs) T1, T2, T3, T4, T5, T6, and T7, a plurality of wiring lines Sn, Sn-1, Sn-2, EM, Vin, DA, and ELVDD selectively connected to the thin film transistors T1, T2, T3, T4, T5, T6, and T7, a capacitor Cst, and an OLED.

The TFTs (T1, T2, T3, T4, T5, T6, and T7) include a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is connected to a third drain electrode D3 of the third thin film transistor T3 and a fourth drain electrode D4 of the fourth thin film transistor T4. A first source electrode S1 of the first thin film transistor T1 is connected to a second drain electrode D2 of the second thin film transistor T2 and a fifth drain electrode D5 of the fifth thin film transistor T5. A first drain electrode D1 of the first thin film transistor T1 is connected to a third source electrode S3 of the third thin film transistor T3 and a sixth source electrode S6 of the sixth thin film transistor T6.

A second gate electrode G2 of the second thin film transistor T2 is connected to a first scan line Sn, a second source electrode S2 of the second thin film transistor T2 is connected to a data line DA, and the second drain electrode D2 of the second thin film transistor T2 is connected to the first source electrode S1 of the first thin film transistor T1.

A third gate electrode G3 of the third thin film transistor T3 is connected to the first scan line Sn, the third source electrode S3 of the third thin film transistor T3 is connected to the first drain electrode D1 of the first thin film transistor T1, and the third drain electrode D3 of the third thin film transistor T3 is connected to the first gate electrode G1 of the first thin film transistor T1.

A fourth gate electrode G4 of the fourth thin film transistor T4 is connected to a second scan line Sn-1, a fourth source electrode S4 of the fourth thin film transistor T4 is connected to an initialization power line (Vin), and the fourth drain electrode D4 of the fourth thin film transistor T4 is connected to the first gate electrode G1 of the first thin film transistor T1.

A fifth gate electrode G5 of the fifth thin film transistor T5 is connected to an emission control line EM, a fifth source electrode S5 of the fifth thin film transistor T5 is connected to a driving power line ELVDD, and the fifth drain electrode D5 of the fifth thin film transistor T5 is connected to the first source electrode S1 of the first thin film transistor T1.

A sixth gate electrode G6 of the sixth thin film transistor T6 is connected to the emission control line EM, and the sixth source electrode S6 of the sixth thin film transistor T6 is connected to the first drain electrode D1 of the first thin film transistor T1.

A seventh gate electrode G7 of the seventh thin film transistor T7 is connected to a third scan line Sn-2, a seventh source electrode S7 of the seventh thin film transistor T7 is connected to the OLED, and a seventh drain electrode D7 of the seventh thin film transistor T7 is connected to the fourth source electrode S4 of the fourth thin film transistor T4.

The wiring lines include the first scan line Sn transferring a first scan signal to each of the second gate electrode G2 and the third gate electrode G3 of each of the second thin film transistor T2 and the third thin film transistor T3. The wiring lines also include the second scan line Sn-1 transferring a second scan signal to the fourth gate electrode G4 of the fourth thin film transistor T4, the third scan line Sn-2 transferring a third scan signal to the seventh gate electrode G7 of the seventh thin film transistor T7, and the emission control line EM transferring a light emitting control signal to each of the fifth gate electrode G5 and the sixth gate electrode G6 of each of the fifth thin film transistor T5 and the sixth thin film transistor T6. The wiring lines also include the data line DA transferring a data signal to the second source electrode S2 of the second thin film transistor T2, the driving power line ELVDD supplying a driving signal to each of one electrode of the capacitor Cst and the fifth source electrode S5 of the fifth thin film transistor T5, and the initialization power line (Vin) supplying an initialization signal to the fourth source electrode S4 of the fourth thin film transistor T4. Here, the data line DA and the driving power line ELVDD can be formed as data wires.

The capacitor Cst includes a first electrode connected to the driving power line (ELVDD) and a second electrode connected to the first gate electrode G1 and the third drain electrode D3 of the third thin film transistor T3.

The OLED includes a first electrode, a second electrode provided on the first electrode, and an organic emission layer provided between the first electrode and the second electrode. The first electrode of the OLED is connected to the seventh source electrode S7 of the seventh thin film transistor T7 and a sixth drain electrode D6 of the sixth thin film transistor T6, and the second electrode of the OLED is connected to a common power ELVSS for transmitting a common signal.

As an example of driving the above-mentioned pixel circuit, when the third scan signal is transferred to the third scan line Sn-2 to turn on the seventh thin film transistor T7, a residual current flowing in the first electrode of the OLED exits to the fourth thin film transistor T4 through the seventh thin film transistor T7, such that unintended light emission of the OLED by the residual current flowing in the first electrode of the OLED is controlled.

When the second scan signal is transmitted to the second scan line Sn-1 and the initialization signal is transmitted to the initialization power line (Vin), the fourth thin film transistor T4 is turned on, such that an initialization voltage by the initialization signal is transmitted to the first gate electrode G1 of the first thin film transistor T1 and the other electrode of the capacitor Cst through the fourth thin film transistor T4. Therefore, the first gate electrode G1 and the capacitor Cst are initialized. In this case, the first gate electrode G1 is initialized and the first thin film transistor T1 is turned on.

When the first scan signal is transmitted to the first scan line Sn and the data signal is transmitted to the data line DA, each of the second thin film transistor T2 and the third thin film transistor T3 is turned on, such that a data voltage (Vd) by the data signal is supplied to the first gate electrode G1 through the second thin film transistor T2, the first thin film transistor T1, and the third thin film transistor T3. In this case, a compensation voltage, {Vd+Vth (here, Vth is a negative (−) value)} the data voltage (Vd) first supplied from the data line DA minus a threshold voltage (Vth) of the first thin film transistor T, is supplied to the first gate electrode G1. The compensation voltage (Vd+Vth) supplied to the first gate electrode G1 is also supplied to the second electrode of the capacitor Cst connected to the first gate electrode G1.

A driving voltage (Vel) by the driving signal from the driving power line ELVDD is supplied to the first electrode of the capacitor Cst, and the above-mentioned compensation voltage (Vd+Vth) is supplied to the second electrode of the capacitor Cst, such that electric charges corresponding to a difference between the voltages each applied to both electrodes of the capacitor Cst are stored in the capacitor Cst, thereby turning on the first thin film transistor T1 for a predetermined time.

When an emission control signal is applied to the emission control line (EM), the fifth thin film transistor T5 and the sixth thin film transistor T6 are turned on to supply the driving voltage (Vel) caused by the driving signal to the first thin film transistor T1 through the fifth thin film transistor T5 from the driving power line (ELVDD).

While the driving voltage (Vel) passes through the first thin film transistor T1 turned on by the capacitor Cst, a driving current Id corresponding to a voltage difference between a voltage supplied to the first gate electrode G1 by the capacitor Cst and the driving voltage (Vel) flows to the first drain electrode D1 of the first thin film transistor T1 and is then supplied to the OLED through the sixth thin film transistor T6 so the OLED emits light for a predetermined time.

The pixel circuit of the OLED display according to an exemplary embodiment includes the first thin film transistor T1 to the seventh thin film transistor T7, the capacitor Cst, the first scan line Sn to the third scan line Sn-2, the data line DA, the driving power supply line ELVDD, and the initialization power line (Vin), but the described technology is not limited thereto. That is, a pixel circuit of an OLED display according to another exemplary embodiment can include wires including at least one thin film transistor, at least one capacitor, at least one scan line, and at least one driving power line.

A pixel of an OLED display according to an exemplary embodiment will now be described with reference to FIG. 2 and FIG. 3. Insulating layers can be positioned between components to be described below, positioned on different layers. These insulating layers can be inorganic insulating layers or organic insulating layers formed of a silicon nitride, a silicon oxide, or the like. Further, the number of insulating layers can be singular or plural.

Figure 2:
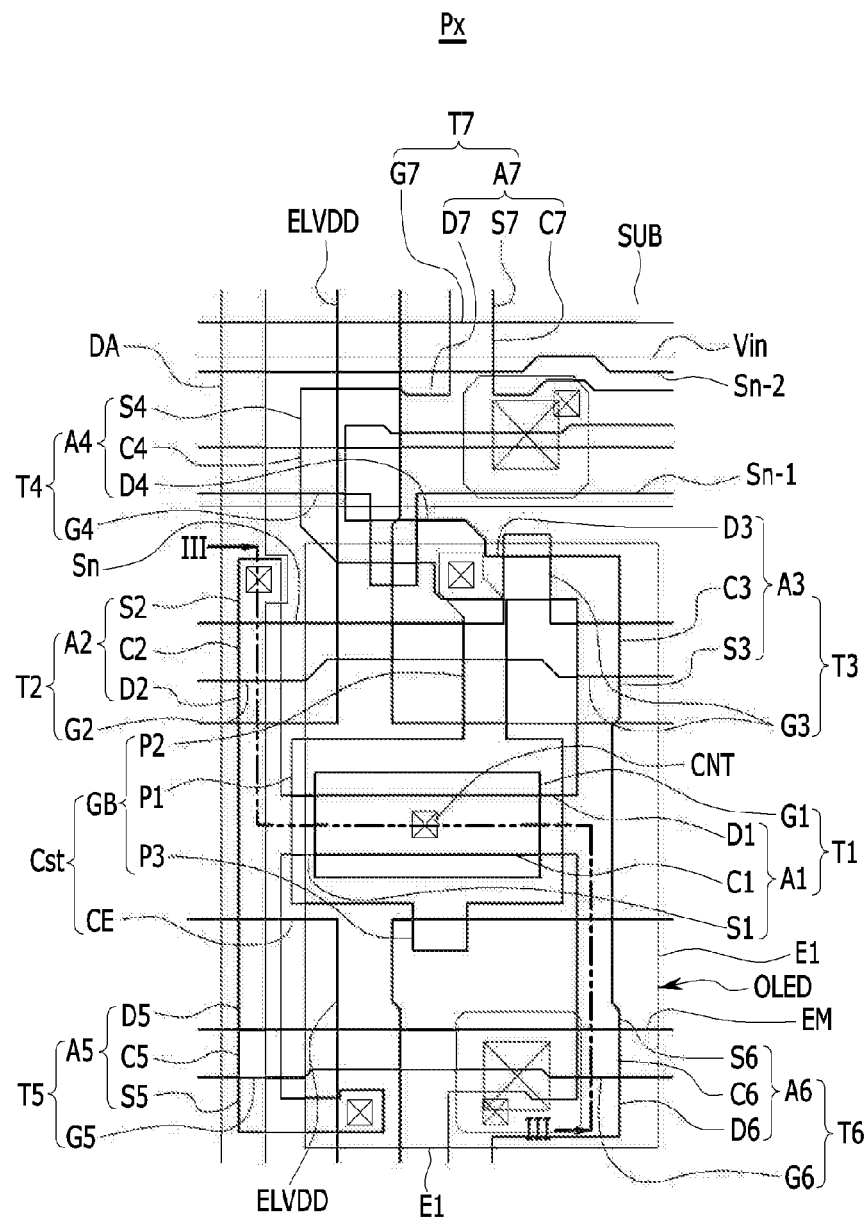
FIG. 2 shows a layout view pf a pixel of an OLED display according to an exemplary embodiment.

FIG. 2 shows a layout view of a pixel of an OLED display according to an exemplary embodiment. FIG. 3 shows a cross-sectional view with respect to a line III-III of FIG. 2.

Figure 3:
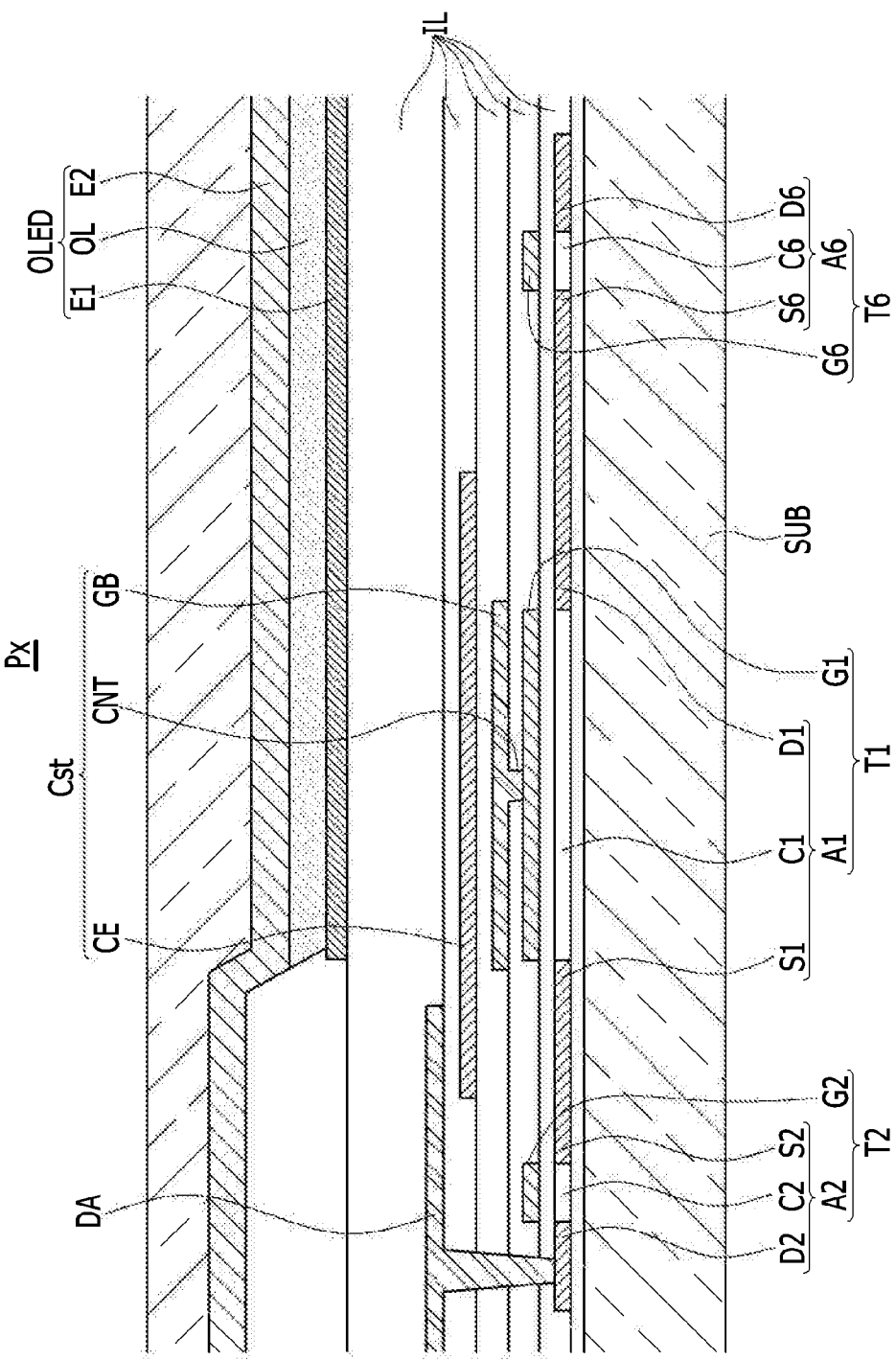
FIG. 3 shows a cross-sectional view with respect to line III-III of FIG. 2.

As shown in FIG. 2 and FIG. 3, the OLED display includes a substrate (SUB) provided corresponding to a pixel (Px), a first thin film transistor T1, a second thin film transistor T2, a third thin film transistor T3, a fourth thin film transistor T4, a fifth thin film transistor T5, a sixth thin film transistor T6, a seventh thin film transistor T7, a first scan line (Sn), a second scan line Sn-1, a third scan line Sn-2, an emission control line (EM), a gate bridge (GB), a driving power line (ELVDD), a capacitor electrode (CE), a data line (DA), an initialization power line (Vin), and an OLED. Here, the first thin film transistor T1 can be a first thin film transistor, and the third thin film transistor T3 can be a second thin film transistor.

Referring to FIG. 2, the second scan line Sn-1 and the third scan line Sn-2 are shown to be separated from each other, and without being limited to this, the second scan line Sn-1 and the third scan line Sn-2 can be formed to be the same line.

The substrate SUB can be formed of glass, quartz, ceramic, sapphire, plastic, metal, or the like, and can be flexible, stretchable, rollable, or foldable. Therefore, the OLED display can be flexible, stretchable, rollable, or foldable.

The first thin film transistor T1 is provided on the substrate (SUB) and includes a first active pattern A1 and a first gate electrode G1.

The first active pattern A1 includes a first source electrode S1, a first channel region C1, and a first drain electrode D1. The first source electrode S1 is connected to a second drain electrode D2 of the second thin film transistor T2 and a fifth drain electrode D5 of the fifth thin film transistor T5, and the first drain electrode D1 is connected to a third source electrode S3 of the third thin film transistor T3 and a sixth source electrode S6 of the sixth thin film transistor T6. The first channel region C1, which is a channel region of the first active pattern A1 overlapping the first gate electrode G1, has a linearly extended form. In another exemplary embodiment, the first channel region that is a channel region of the first active pattern is bent and extended at least once.

The first active pattern A1 can be formed of a polysilicon or an oxide semiconductor. The oxide semiconductor can include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and a zinc oxide (ZnO), an indium-gallium-zinc oxide (In-GaZnO4), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zn—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. When the first active pattern A1 is formed of the oxide semiconductor, a passivation layer can be added in order to protect the oxide semiconductor vulnerable to an external environment such as a high temperature, or the like.

The first channel region C1 of the first active pattern A1 can be channel-region-doped with N-type impurities or P-type impurities, and the first source electrode S1 and the first drain electrode D1 can be spaced apart from each other with the first channel region C1 interposed therebetween and be doped with opposite type impurities to the impurities with which the first channel region C1 is doped.

The first gate electrode G1 is positioned on the first channel region C1 of the first active pattern A1 and has an island shape. The first gate electrode G1 is connected to a gate bridge (GB) passing through a contact hole (CNT). The first gate electrode G1 is connected to a fourth drain electrode D4 of the fourth thin film transistor T4 and a third drain electrode D3 of the third thin film transistor T3 by the gate bridge (GB). The first gate electrode G1 overlaps the gate bridge (GB) and is covered by the gate bridge (GB).

The second thin film transistor T2 is provided on the substrate (SUB) and includes a second active pattern A2 and a second gate electrode G2. The second active pattern A2 includes a second source electrode S2, a second channel region C2, and a second drain electrode D2. The second source electrode S2 is connected to the data line (DA) through a contact hole, and the second drain electrode D2 is connected to the first source electrode S1 of the first thin film transistor T1. A second channel region C2 that is a channel region of the second active pattern A2 overlapping the second gate electrode G2 is provided between the second source electrode S2 and the second drain electrode D2.

The second channel region C2 of the second active pattern A2 can be a channel region doped with an N-type impurity or a P-type impurity, and the second source electrode S2 and the second drain electrode D2 can be separated from each other with the second channel region C2 therebetween and can be doped with an opposite type of doping impurity to the doping impurity doped to the second channel region C2. The second active pattern A2 is provided on the same layer as the first active pattern A1 and is connected to the first active pattern A1. The second active pattern A2 is formed of the same material as the first active pattern A1 and is integrally formed with the first active pattern A1.

The second gate electrode G2 is provided in the second channel region C2 of the second active pattern A2 and is integrally formed with the first scan line (Sn).

The third thin film transistor T3 is provided on the substrate (SUB) and includes a third active pattern A3 and a third gate electrode G3.

The third active pattern A3 includes a third source electrode S3, a third channel region C3, and a third drain electrode D3. The third source electrode S3 is connected to the first drain electrode D1, and the third drain electrode D3 is connected to the first gate electrode G1 of the first thin film transistor T1 by the gate bridge (GB) passing through a contact hole. The third channel region C3 that is a channel region of the third active pattern A3 overlapping the third gate electrode G3 is provided between the third source electrode S3 and the third drain electrode D3. That is, the third active pattern A3 connects the first active pattern A1 and the first gate electrode G1.

The third channel region C3 of the third active pattern A3 can be a channel region doped with an N-type impurity or a P-type impurity, and the third source electrode S3 and the third drain electrode D3 are separated from each other with the third channel region C3 therebetween and can be doped with an opposite type of doping impurity to the doping impurity doped to the third channel region C3. The third active pattern A3 is provided on the same layer as the first active pattern A1 and the second active pattern A2. The third active pattern A3 is formed of the same material as the first active pattern A1 and the second active pattern A2. And the third active pattern A3 is integrally formed with the first active pattern A1 and the second active pattern A2.

The third gate electrode G3 is provided in the third channel region C3 of the third active pattern A3 and is integrally formed with the first scan line (Sn). The third gate electrode G3 is formed of a dual gate electrode but it not limited thereto.

The fourth thin film transistor T4 is provided on the substrate (SUB) and includes a fourth active pattern A4 and a fourth gate electrode G4.

The fourth active pattern A4 includes a fourth source electrode S4, a fourth channel region C4, and a fourth drain electrode D4. The fourth source electrode S4 is connected to the initialization power line (Vin) through a contact hole, and the fourth drain electrode D4 is connected to the first gate electrode G1 of the first thin film transistor T1 by the gate bridge (GB) passing through a contact hole. A fourth channel region C4 that is a channel region of the fourth active pattern A4 overlapping the fourth gate electrode G4 is provided between the fourth source electrode S4 and the fourth drain electrode D4. That is, the fourth active pattern A4 connects between the initialization power line (Vin) and the first gate electrode G1, and is connected to the third active pattern A3 and the first gate electrode G1.

The fourth channel region C4 of the fourth active pattern A4 can be a channel region doped with an N-type impurity or a P-type impurity, and the fourth source electrode S4 and the fourth drain electrode D4 are separated from each other with the fourth channel region C4 therebetween and can be doped with an opposite type of doping impurity to the doping impurity doped to the fourth channel region C4. The fourth active pattern A4 is provided on the same layer as the first active pattern A1, the second active pattern A2, and the third active pattern A3, is formed of the same material as the first active pattern A1, the second active pattern A2, and the third active pattern A3, and is integrally formed with the first active pattern A1, the second active pattern A2, and the third active pattern A3.

The fourth gate electrode G4 is provided in the fourth channel region C4 of the fourth active pattern A4 and is integrally formed with the second scan line Sn-1. The fourth gate electrode G4 is formed as a dual gate electrode but is not limited thereto.

The fifth thin film transistor T5 is provided on the substrate (SUB) and includes a fifth active pattern A5 and a fifth gate electrode G5.

The fifth active pattern A5 includes a fifth source electrode S5, a fifth channel region C5, and a fifth drain electrode D5. The fifth source electrode S5 is connected to the driving power line (ELVDD) through a contact hole, and the fifth drain electrode D5 is connected to the first source electrode S1 of the first thin film transistor T1. A fifth channel region C5 that is a channel region of the fifth active pattern A5 overlapping the fifth gate electrode G5 is provided between the fifth source electrode S5 and the fifth drain electrode D5. That is, the fifth active pattern A5 connects between the driving power line (ELVDD) and the first active pattern A1.

The fifth channel region C5 of the fifth active pattern A5 can be a channel region doped with an N-type impurity or a P-type impurity, and the fifth source electrode S5 and the fifth drain electrode D5 are separated from each other with the fifth channel region C5 therebetween and can be doped with an opposite type of doping impurity to the doping impurity doped to the fifth channel region C5. The fifth active pattern A5 is provided on the same layer as the first active pattern A1, the second active pattern A2, the third active pattern A3, and the fourth active pattern A4. The fifth active pattern A5 is formed with the same material as the first active pattern A1, the second active pattern A2, the third active pattern A3, and the fourth active pattern A4. And the fifth active pattern A5 is integrally formed with the first active pattern A1, the second active pattern A2, the third active pattern A3, and the fourth active pattern A4.

The fifth gate electrode G5 is provided in the fifth channel region C5 of the fifth active pattern A5 and is integrally formed with the emission control line (EM).

The sixth thin film transistor T6 is provided on the substrate (SUB) and includes a sixth active pattern A6 and a sixth gate electrode G6.

The sixth active pattern A6 includes a sixth source electrode S6, a sixth channel region C6, and a sixth drain electrode D6. The sixth source electrode S6 is connected to a first drain electrode D1 of the first thin film transistor T1, and the sixth drain electrode D6 is connected to a first electrode E1 of the OLED through a contact hole. A sixth channel region C6 that is a channel region of the sixth active pattern A6 overlapping the sixth gate electrode G6 is provided between the sixth source electrode S6 and the sixth drain electrode D6. That is, the sixth active pattern A6 connects between the first active pattern A1 and the first electrode E1 of the OLED.

The sixth channel region C6 of the sixth active pattern A6 can be a channel region doped with an N-type impurity or a P-type impurity, and the sixth source electrode S6 and the sixth drain electrode D6 are separated from each other with the sixth channel region C6 therebetween and can be doped with an opposite type of doping impurity to the doping impurity doped to the sixth channel region C6. The sixth active pattern A6 is provided on the same layer as the first active pattern A1, the second active pattern A2, the third active pattern A3, the fourth active pattern A4, and the fifth active pattern A5. The sixth active pattern A6 is formed of the same material as the first active pattern A1, the second active pattern A2, the third active pattern A3, the fourth active pattern A4, and the fifth active pattern A5 And the sixth active pattern A6 is integrally formed with the first active pattern A1, the second active pattern A2, the third active pattern A3, the fourth active pattern A4, and the fifth active pattern A5.

The sixth gate electrode G6 is provided in a sixth channel region C6 of the sixth active pattern A6 and is integrally formed with the emission control line (EM).

The seventh thin film transistor T7 is provided on the substrate (SUB) and includes a seventh active pattern A7 and a seventh gate electrode G7.

The seventh active pattern A7 includes a seventh source electrode S7, a seventh channel region C7, and a seventh drain electrode D7. The seventh source electrode S7 is connected to a first electrode of an OLED of another pixel (which can be a pixel provided on an upper side of the pixel shown in FIG. 2) that is not shown in FIG. 3, and the seventh drain electrode D7 is connected to a fourth source electrode S4 of the fourth thin film transistor T4. A seventh channel region C7 that is a channel region of the seventh active pattern A7 overlapping the seventh gate electrode G7 is provided between the seventh source electrode S7 and the seventh drain electrode D7. That is, the seventh active pattern A7 connects between the first electrode of the OLED and the fourth active pattern A4.

The seventh channel region C7 of the seventh active pattern A7 can be a channel region doped with an N-type impurity or a P-type impurity, and the seventh source electrode S7 and the seventh drain electrode D7 are separated from each other with the seventh channel region C7 therebetween and can be doped with an opposite type of doping impurity to the doping impurity doped to the seventh channel region C7. The seventh active pattern A7 is provided on the same layer as the first active pattern A1, the second active pattern A2, the third active pattern A3, the fourth active pattern A4, the fifth active pattern A5, and the sixth active pattern A6, is formed of the same material as the first active pattern A1, the second active pattern A2, the third active pattern A3, the fourth active pattern A4, the fifth active pattern A5, and the sixth active pattern A6, and is integrally formed with the first active pattern A1, the second active pattern A2, the third active pattern A3, the fourth active pattern A4, the fifth active pattern A5, and the sixth active pattern A6.

The seventh gate electrode G7 is provided in a seventh channel region C7 of the seventh active pattern A7 and is integrally formed with the third scan line Sn-2.

An insulating layer (IL) is provided from a gap between the first active pattern A1 and the first gate electrode G1 to a gap between the seventh active pattern A7 and the seventh gate electrode G7, and the insulating layer (IL) can be an inorganic insulating layer or an organic insulating layer such as a silicon nitride or a silicon oxide. The insulating layer can be formed in a singular or plural number.

The first scan line (Sn) is provided on the second active pattern A2 and the third active pattern A3 with the insulating layer (IL) therebetween and extends to traverse the second active pattern A2 and the third active pattern A3, and it is integrally formed with the second gate electrode G2 and the third gate electrode G3 and is connected to the second gate electrode G2 and the third gate electrode G3.

The second scan line Sn-1 is separated from the first scan line (Sn) and is provided on the fourth active pattern A4 with the insulating layer (IL) therebetween, it extends to traverse the fourth active pattern A4, and it is integrally formed with the fourth gate electrode G4 and is connected to the fourth gate electrode G4.

The third scan line Sn-2 is separated from the second scan line Sn-1 and is provided on the seventh active pattern A7 with the insulating layer (IL) therebetween, it extends to traverse the seventh active pattern A7, and it is integrally formed with the seventh gate electrode G7 and is connected to the seventh gate electrode G7.

The emission control line (EM) is separated from the first scan line (Sn) and is provided on the fifth active pattern A5 and the sixth active pattern A6 with the insulating layer (IL) therebetween, it extends to traverse the fifth active pattern A5 and the sixth active pattern A6, and it is integrally formed with the fifth gate electrode G5 and the sixth gate electrode G6 and is connected to the fifth gate electrode G5 and the sixth gate electrode G6.

The above-noted emission control line (EM), the third scan line Sn-2, the second scan line Sn-1, the first scan line (Sn), the first gate electrode G1, the second gate electrode G2, the third gate electrode G3, the fourth gate electrode G4, the fifth gate electrode G5, the sixth gate electrode G6, and the seventh gate electrode G7 are provided on the same layer and formed of the same material. In another exemplary embodiment, the emission control line (EM), the third scan line Sn-2, the second scan line Sn-1, the first scan line (Sn), the first gate electrode G1, the second gate electrode G2, the third gate electrode G3, the fourth gate electrode G4, the fifth gate electrode G5, the sixth gate electrode G6, and the seventh gate electrode G7 can be selectively provided on different layers and can be formed of different materials.

The gate bridge (GB) is provided on the first gate electrode G1 with the insulating layer (IL) therebetween and is connected to the first gate electrode G1 through a contact hole (CNT) formed in the insulating layer (IL). The gate bridge (GB) is connected to the third drain electrode D3 of the third active pattern A3 and the fourth drain electrode D4 of the fourth active pattern A4 through the contact hole and is connected to the first gate electrode G1 through the contact hole (CNT). That is, the gate bridge (GB) connects between the third active pattern A3 of the third thin film transistor T3 and the first gate electrode G1 of the first thin film transistor T1. The gate bridge (GB) covers the first gate electrode G1. The gate bridge (GB) connects between the first gate electrode G1 and the third active pattern A3, and forms a capacitor electrode (CE) and a capacitor Cst provided on the gate bridge (GB). That is, the gate bridge (GB) is formed as a first electrode of the capacitor Cst. The gate bridge (GB) can include a metal which can be identical with that of the capacitor electrode (CE) or can include another metal.

The gate bridge (GB) includes an overlapped portion P1, an extension P2, and a protrusion P3 that are integrally formed.

The overlapped portion P1 is provided on the first gate electrode G1 to cover the first gate electrode G1 and overlaps the capacitor electrode (CE) provided on the gate bridge (GB). That is, the overlapped portion P1 is provided between the first gate electrode G1 and the capacitor electrode (CE) so the gate bridge (GB) is provided between the first gate electrode G1 and the capacitor electrode (CE). The overlapped portion P1 is connected to the first gate electrode G1 through the contact hole (CNT).

The extension P2 extends to the third active pattern A3 from the overlapped portion P1 and is connected to the third drain electrode D3 of the third active pattern A3 through the contact hole.

The protrusion P3 protrudes from the overlapped portion P1, and at least part thereof does not overlap the capacitor electrode (CE).

As described, the gate bridge (GB) that is a first electrode for forming the capacitor Cst includes an extension P2 and a protrusion P3. So, when the capacitor electrode (CE) for forming the capacitor Cst together with the gate bridge (GB) is formed upward or downward due a processing error in FIG. 2, an area corresponding to the distance of the capacitor electrode (CE) moved by the processing error is compensated by the extension P2 or the protrusion P3, thereby controlling the change of capacitance of the capacitor Cst caused by the processing error.

The driving power line (ELVDD) is provided on a different layer from the data line (DA) on the substrate (SUB), and it neighbors the data line (DA). For example, the driving power line (ELVDD) is provided below the data line (DA). The driving power line (ELVDD) traverses the first scan line (Sn) with the insulating layer (IL) therebetween. The driving power line (ELVDD) extends in a first direction to traverse the first scan line (Sn), is connected to the capacitor electrode (CE), and is connected to the fifth source electrode S5 of the fifth active pattern A5 connected to the first active pattern A1. The driving power line (ELVDD) is integrally formed with the capacitor electrode (CE), and the capacitor electrode (CE) is formed in a shape such that the driving power line (ELVDD) is extended. The driving power line (ELVDD) extends in a first direction to traverse the first scan line (Sn), the second scan line Sn-1, the third scan line Sn-2, and the emission control line (EM).

The capacitor electrode (CE) is provided on the gate bridge (GB) with the insulating layer (IL) therebetween, and overlaps the gate bridge (GB) to form a capacitor Cst together with the gate bridge (GB). The capacitor electrode (CE) is formed as a second electrode of the capacitor Cst. The capacitor electrode (CE) is provided on a different layer from the gate bridge (GB), and is formed of a different or identical metal from/with the gate bridge (GB). The capacitor electrode (CE) is integrally formed with the driving power line (ELVDD) and extends in a second direction crossing the first direction that is an extended direction of the driving power line (ELVDD). The capacitor electrode (CE) is integrally formed with the driving power line (ELVDD) so it is provided on the same layer as the driving power line (ELVDD) or provided on a different layer from the data line (DA). The capacitor electrode (CE) extends in the second direction and the driving power line (ELVDD) extends in the first direction so the capacitor electrode (CE) and the driving power line (ELVDD) are integrally formed to extend in different directions on the substrate (SUB).

The data line (DA) is provided on the capacitor electrode (CE) with the insulating layer (IL) therebetween and extends in a first direction to traverse the first scan line (Sn). The data line (DA) is connected to the second source electrode S2 of the second active pattern A2 through a contact hole. The data line (DA) extends in a first direction to traverse the first scan line (Sn), the second scan line Sn-1, the third scan line Sn-2, the emission control line (EM), and the capacitor electrode (CE) on the substrate (SUB). The data line (DA) is provided on different layers from the driving power line (ELVDD), the capacitor electrode (CE), and the gate bridge (GB) on the substrate (SUB).

The initialization power line (Vin) is connected to the fourth source electrode S4 of the fourth active pattern A4 through a contact hole. The initialization power line (Vin) is provided on the same layer as the first electrode E1 of the OLED and is formed of the same material. In another exemplary embodiment, the initialization power line (Vin) is provided on a different layer from the first electrode E1 and is formed of a different material.

The OLED includes a first electrode E1, an organic emission layer OL, and a second electrode E2. The first electrode E1 is connected to the sixth drain electrode D6 of the sixth thin film transistor T6 through a contact hole. The organic emission layer OL is provided between the first electrode E1 and the second electrode E2. The second electrode E2 is provided on the organic emission layer OL. At least one of the first electrode E1 and the second electrode E2 can be at least one of a light transmitting electrode, a light reflecting electrode, and a light semi-transmitting electrode, and the light emitted by the organic emission layer OL can emit to at least one electrode direction of the first electrode E1 and the second electrode E2.

A capping layer for covering the OLED can be provided on the OLED, and a thin film encapsulation layer or an encapsulation substrate can be provided on the OLED with the capping layer therebetween.

Regarding the OLED display according to an exemplary embodiment, the first gate electrode G1 and the capacitor electrode (CE) do not form the capacitor Cst but the gate bridge (GB) and the capacitor electrode (CE) provided on the first gate electrode G1 form the capacitor Cst so an area of the capacitor Cst for forming capacitance can be set on a predetermined surface irrespective of the area or position of the first gate electrode G1. Accordingly, when the high-resolution OLED display with the increased pixels per inch (ppi), the area of the capacitor Cst can be set regardless of the area or position of the first gate electrode G1, thereby improving capacitance formed by the capacitor Cst.

In addition, the first gate electrode G1 and the capacitor electrode (CE) do not form the capacitor Cst but the gate bridge (GB) and the capacitor electrode (CE) provided on the first gate electrode G1 form the capacitor Cst so there is no need to form an opening in the capacitor electrode (CE) for forming the first gate electrode G1 and the capacitor so as to connect the gate bridge (GB) and the first gate electrode G1, thereby preventing deterioration of capacitance of the capacitor Cst by the opening formed by the capacitor electrode (CE).

Further, the gate bridge (GB) that is a first electrode for forming the capacitor Cst includes the extension P2 and the protrusion P3, so when the capacitor electrode (CE) that is a second electrode for forming the capacitor Cst together with the gate bridge (GB) moves in an undesired direction because of a processing error, an area that corresponds to the moving distance of the capacitor electrode (CE) is compensated by the extension P2 or the protrusion P3, thereby controlling the change of capacitance formed by the capacitor Cst by the processing error.

That is, when manufactured a high-resolution OLED display with an increased number of pixels per inch (ppi), the OLED display with improved capacitance formed by the capacitor Cst is provided.

An OLED display according to another exemplary embodiment will now be described with reference to FIG. 4 and FIG. 5. A configuration that is different from the OLED display according to an exemplary embodiment will now be described.

Figure 4:
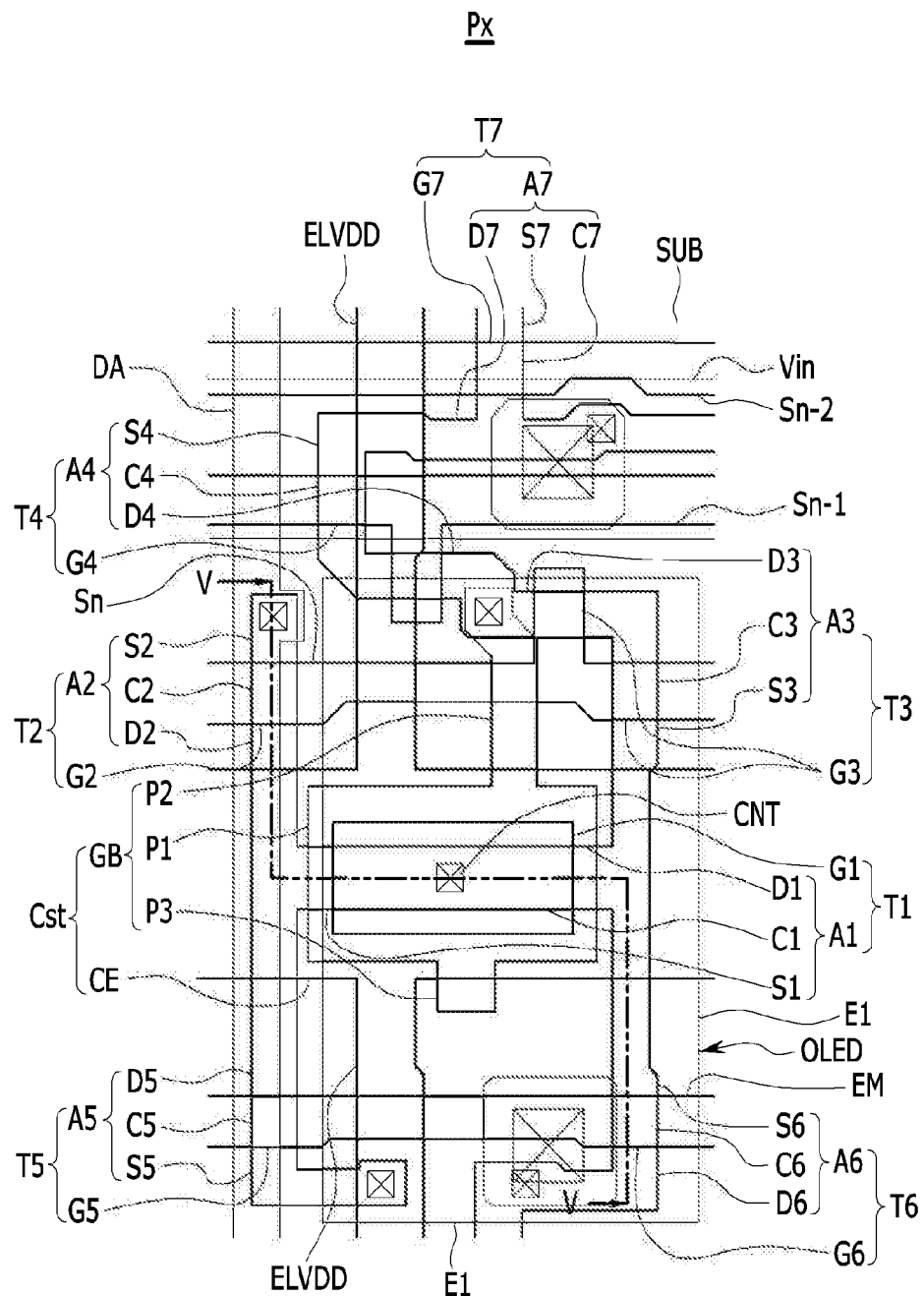
FIG. 4 shows a layout view pf a pixel of an OLED display according to another exemplary embodiment.

FIG. 4 shows a layout view of a pixel of an OLED display according to another exemplary embodiment. FIG. 5 shows a cross-sectional view with respect to a line V-V of FIG. 4.

Figure 5:
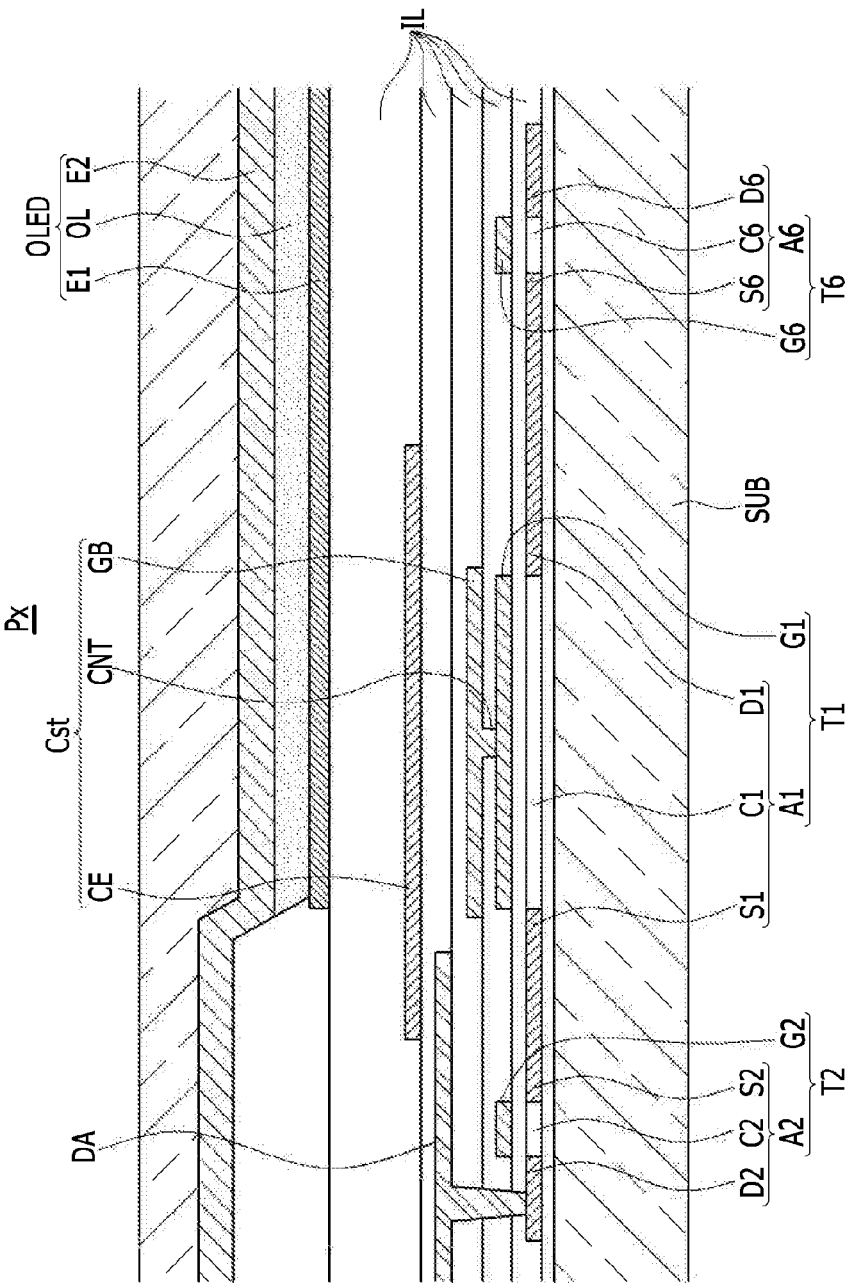
FIG. 5 shows a cross-sectional view with respect to line V-V of FIG. 4.

As shown in FIG. 4 and FIG. 5, the OLED display according to another exemplary embodiment includes a substrate (SUB) that can be provided corresponding to a pixel (Px), a first thin film transistor T1, a second thin film transistor T2, a third thin film transistor T3, a fourth thin film transistor T4, a fifth thin film transistor T5, a sixth thin film transistor T6, a seventh thin film transistor T7, a first scan line (Sn), a second scan line Sn-1, a third scan line Sn-2, an emission control line (EM), a gate bridge (GB), a driving power line (ELVDD), a capacitor electrode (CE), a data line (DA), an initialization power line (Vin), and an OLED.

The driving power line (ELVDD) is provided on a different layer from the data line (DA) on the substrate (SUB), and it neighbors the data line (DA). For example, the driving power line (ELVDD) is provided on the data line (DA) with the insulating layer (IL) therebetween.

The capacitor electrode (CE) is provided on the gate bridge (GB) with a multi-layered insulating layer (IL), and it overlaps the gate bridge (GB) to form a capacitor Cst together with the gate bridge (GB). The capacitor electrode (CE) is formed as a second electrode of the capacitor Cst. The capacitor electrode (CE) is provided on a different layer from the gate bridge (GB), and is formed of a different or identical metal from/as the gate bridge (GB). The capacitor electrode (CE) is integrally formed with the driving power line (ELVDD) and is extended in a second direction that crosses the first direction in which the driving power line (ELVDD) is extended. The capacitor electrode (CE) is provided on the same layer as the driving power line (ELVDD) but is provided on a different layer from the data line (DA). The capacitor electrode (CE) is provided on the data line (DA) with the insulating layer (IL) therebetween. The capacitor electrode (CE) is extended in the second direction and the driving power line (ELVDD) is extended in the first direction so the capacitor electrode (CE) and the driving power line (ELVDD) are respectively integrally formed and are extended in different directions on the substrate (SUB).

The data line (DA) is provided below the capacitor electrode (CE) with the insulating layer (IL) therebetween, and it is extended in a first direction traversing the first scan line (Sn). The data line (DA) is connected to the second source electrode S2 of the second active pattern A2 through a contact hole. The data line (DA) is extended in a first direction traversing the first scan line (Sn), the second scan line Sn-1, the third scan line Sn-2, the emission control line (EM), and the capacitor electrode (CE) on the substrate (SUB). The data line (DA) is provided on different layers from the driving power line (ELVDD), the capacitor electrode (CE), and the gate bridge (GB) on the substrate (SUB).

As described, regarding the OLED display according to another exemplary embodiment, the first gate electrode G1 and the capacitor electrode (CE) do not form the capacitor Cst, but the gate bridge (GB) and the capacitor electrode (CE) provided on the first gate electrode G1 form the capacitor Cst, so an area of the capacitor Cst for forming capacitance can be set on a predetermined surface irrespective of the area or position of the first gate electrode G1. Accordingly, when the high-resolution OLED display with the increased number of pixels per inch (ppi) is manufactured, the area of the capacitor Cst can be set regardless of the area or position of the first gate electrode G1, thereby improving capacitance formed by the capacitor Cst.

In addition, the first gate electrode G1 and the capacitor electrode (CE) do not form the capacitor Cst but the gate bridge (GB) and the capacitor electrode (CE) provided on the first gate electrode G1 form the capacitor Cst so there is no need to form an opening in the capacitor electrode (CE) for forming the first gate electrode G1 and the capacitor so as to connect the gate bridge (GB) and the first gate electrode G1, thereby preventing deterioration of capacitance of the capacitor Cst by the opening formed by the capacitor electrode (CE).

That is, when manufactured as a high-resolution OLED display with an increased number of pixels per inch (ppi), the OLED display with improved capacitance formed by the capacitor Cst is provided.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display comprising:
    a substrate;
    a first thin film transistor (TFT) disposed over the substrate and including a gate electrode;
    a second TFT electrically connected to the first TFT;
    a gate bridge disposed over the gate electrode and configured to electrically connect the gate electrode and the second TFT, wherein the gate bridge is connected to the gate electrode through a contact hole disposed over the first TFT;
    a capacitor electrode disposed over the gate bridge;
    an insulating layer interposed between the capacitor electrode and the gate bridge, wherein the capacitor electrode, the insulating layer, and the gate bridge form a capacitor; and
    an OLED electrically connected to the first TFT.

2. The OLED display of claim 1, further comprising a driving power line electrically connected to the first TFT, wherein the driving power line is integrally formed with the capacitor electrode.

3. An OLED display comprising:
    a substrate;
    a first thin film transistor (TFT) disposed over the substrate and including a first gate electrode;
    a second TFT electrically connected to the first TFT;
    a data line electrically connected to the second TFT;
    a third TFT electrically connected to the first TFT;
    a gate bridge disposed over the first gate electrode and configured to electrically connect the third TFT and the first gate electrode, wherein the gate bridge is connected to the first gate electrode through a contact hole disposed over the first TFT;
    a capacitor electrode disposed over and overlapping the gate bridge in the depth dimension of the OLED display;
    an insulating layer interposed between the capacitor electrode and the gate bridge, wherein the capacitor electrode, the insulating layer, and the gate bridge form a capacitor; and
    an OLED electrically connected to the first TFT.

4. The OLED display of claim 3, wherein the gate bridge covers the first gate electrode.

5. The OLED display of claim 3, further comprising a driving power line electrically connected to the first TFT, wherein the capacitor electrode is integrally formed with the driving power line.

6. The OLED display of claim 5, wherein the data line and the capacitor electrode are disposed on different layers.

7. An OLED display comprising:
    a substrate;
    a first thin film transistor (TFT) including a first active pattern disposed over the substrate and a first gate electrode disposed over the first active pattern;
    a second TFT including a second active pattern connected to a first terminal of the first active pattern and a second gate electrode disposed over the second active pattern;
    a data line disposed over the second active pattern and electrically connected to the second active pattern;
    a third TFT including a third active pattern electrically connected to a second terminal of the first active pattern and a third gate electrode disposed over the third active pattern;
    a gate bridge disposed over the first gate electrode and configured to electrically connect the third active pattern and the first gate electrode, wherein the gate bridge is connected to the first gate electrode through a contact hole disposed over the first TFT;
    a driving power line neighboring the data line and electrically connected to the first active pattern;
    a capacitor electrode electrically connected to the driving power line and disposed over the gate bridge;
    an insulating layer interposed between the capacitor electrode and the gate bridge, wherein the capacitor electrode, the insulating layer and the gate bridge form a capacitor; and
    an OLED electrically connected to the first active pattern.

8. The OLED display of claim 7, wherein the gate bridge covers the first gate electrode.

9. The OLED display of claim 7, wherein the gate bridge includes:
    an overlapped portion overlapping the capacitor electrode;
    an extension extending from the overlapped portion to the third active pattern; and
    a protrusion protruding from the overlapped portion, wherein at least a portion of the protrusion does not overlap the capacitor electrode.

10. The OLED display of claim 9, wherein the overlapped portion is connected to the first gate electrode through the contact hole.

11. The OLED display of claim 7, wherein the data line extends in a first direction, and wherein the capacitor electrode extends in a second direction crossing the data line.

12. The OLED display of claim 11, wherein the data line and the capacitor electrode are disposed on different layers.

13. The OLED display of claim 12, wherein the data line is disposed over the capacitor electrode.

14. The OLED display of claim 12, wherein the capacitor electrode is disposed over the data line.

15. The OLED display of claim 7, wherein the capacitor electrode is integrally disposed with the driving power line.

16. The OLED display of claim 15, wherein the capacitor electrode and the driving power line extend in different directions.

17. The OLED display of claim 7, wherein the gate bridge and the capacitor electrode are formed of a metal.

18. The OLED display of claim 7, further comprising:
a first scan line disposed over the second and third active patterns and electrically connected to the second and third gate electrodes;
a fourth TFT including i) a fourth active pattern connected to the third active pattern and connected to the first gate electrode through the gate bridge and ii) a fourth gate electrode disposed over the fourth active pattern;
a second scan line disposed over the fourth active pattern and electrically connected to the fourth gate electrode; and
an initialization power line electrically connected to the fourth active pattern.

19. The OLED display of claim 18, further comprising:
a fifth TFT including a fifth active pattern electrically connected to the driving power line and a fifth gate electrode disposed over the fifth active pattern;
a sixth TFT including a sixth active pattern electrically connected to the OLED and a sixth gate electrode disposed over the sixth active pattern; and
an emission control line disposed over the fifth and sixth active patterns, wherein the emission control line is connected to the fifth and sixth gate electrodes.

20. The OLED display of claim 19, further comprising:
a seventh TFT including a seventh active pattern connected to the fourth active pattern and a seventh gate electrode disposed over the seventh active pattern; and
a third scan line disposed over the seventh active pattern and connected to the seventh gate electrode.

* * * * *